(12) United States Patent
Han et al.

(10) Patent No.: US 12,334,386 B2
(45) Date of Patent: Jun. 17, 2025

(54) APPARATUS AND METHOD FOR TREATING SUBSTRATE

(71) Applicant: SEMES CO., LTD., Chungcheongnam-do (KR)

(72) Inventors: Kiwon Han, Gyeonggi-do (KR); Tae Kyung Kong, Chungcheongnam-do (KR); Jin Sung Sun, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 558 days.

(21) Appl. No.: 17/513,551

(22) Filed: Oct. 28, 2021

(65) Prior Publication Data

US 2022/0130710 A1    Apr. 28, 2022

(30) Foreign Application Priority Data

Oct. 28, 2020  (KR) .................. 10-2020-0141446

(51) Int. Cl.
*H01L 21/67* (2006.01)
*G03F 7/16* (2006.01)
(Continued)

(52) U.S. Cl.
CPC ........ *H01L 21/68707* (2013.01); *G03F 7/168* (2013.01); *H01L 21/027* (2013.01); *H01L 21/67109* (2013.01); *H01L 21/6715* (2013.01); *H01L 21/67167* (2013.01); *H01L 21/67173* (2013.01); *G03F 7/091* (2013.01)

(58) Field of Classification Search
CPC ............. H01L 21/68707; H01L 21/027; H01L 21/67109; H01L 21/6715; H01L 21/67167; H01L 21/67173; H01L 21/67178; H01L 21/67103; H01L 21/67184; H01L 21/67196; H01L 21/67706; H01L 21/67742; H01L 21/67225; G03F 7/168; G03F 7/091; G03F 7/162

See application file for complete search history.

(56) References Cited

U.S. PATENT DOCUMENTS

2016/0035601 A1    2/2016  Eum et al.
2020/0144084 A1*  5/2020  Ikeda ............... H01L 21/67115
(Continued)

FOREIGN PATENT DOCUMENTS

CN    108107680 A      6/2018
CN    110047779 A  *   7/2019    .......... F27B 17/0025
(Continued)

*Primary Examiner* — Mohammed Shamsuzzaman
(74) *Attorney, Agent, or Firm* — Procopio, Cory, Hargreaves & Savitch LLP

(57) ABSTRACT

An apparatus for treating a substrate includes a transfer part, a first transfer robot and a second transfer robot disposed in a longitudinal direction of the transfer part, a liquid treating part disposed at one side of the transfer part to apply a liquid onto the substrate by supplying the liquid to the substrate, and a heat treating part disposed at an opposite side of the transfer part to face a first process treating part, to perform heat-treatment with respect to the substrate. The heat treating part includes a cooling transfer module to transfer the substrate between the first transfer robot and the second transfer robot and to cool the substrate.

8 Claims, 10 Drawing Sheets

(51) Int. Cl.
  *H01L 21/027* (2006.01)
  *H01L 21/687* (2006.01)
  *G03F 7/09* (2006.01)
  *H01L 21/02* (2006.01)

(56) References Cited

U.S. PATENT DOCUMENTS

2020/0243357 A1\* 7/2020 Ito .................... H01L 21/68707
2021/0057245 A1\* 2/2021 Ueno ................ H01L 21/67248

FOREIGN PATENT DOCUMENTS

| | | | | |
|---|---|---|---|---|
| JP | H07231027 | A | 8/1995 | |
| JP | H09153537 | A  \* | 6/1997 | .............. F27B 15/14 |
| JP | H10256344 | A | 9/1998 | |
| JP | 2003007795 | A | 1/2003 | |
| JP | 2003203960 | A | 7/2003 | |
| JP | 2005101058 | A | 4/2005 | |
| JP | 2009010291 | A | 1/2009 | |
| JP | 2009071008 | A | 4/2009 | |
| JP | 4499147 | B2 \* | 7/2010 | .............. F27B 15/14 |
| KR | 100684627 | B1 | 2/2007 | |
| KR | 1020080016782 | A | 2/2008 | |
| KR | 1020090046800 | A | 5/2009 | |
| KR | 1020160017699 | A | 2/2016 | |
| KR | 1020190053340 | A | 5/2019 | |
| KR | 1020190053341 | A | 5/2019 | |

\* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2020-0141446 filed on Oct. 28, 2020, in the Korean Intellectual Property Office, the entire contents of which are hereby incorporated by reference.

BACKGROUND

Embodiments of the inventive concept described herein relate to an apparatus and a method for treating a substrate, and more particularly, relate to an apparatus and a method for forming a liquid film.

To fabricate a semiconductor device, various patterns have to be formed on a substrate such as a semiconductor wafer. A semiconductor pattern is formed by subsequently performing a depositing process, a lithography process, and etching process Among them, the photolithography process includes a coating process of coating a photosensitive liquid, such as a photoresist, onto a substrate to form a photoresist film on the substrate, an exposure process of transferring a pattern, which is formed on a reticle, to the photoresist film on the substrate to form a circuit, and a developing process of supplying a development liquid onto the photoresist film of the substrate to selectively remove the exposed region or an inverse region. Heat treatment is performed with respect to the substrate before and after coating the photoresist onto the substrate, and before and after supplying the developing liquid onto the substrate.

Korean Unexamined Patent Publication No. 2016-0017699 discloses one example of a substrate treating device, which performs the above-described coating process and developing process. Accordingly, the substrate treating device has a coating module and a developing module stacked on each other, and each of the coating module and the developing module has a transfer chamber, a liquid treating chamber, and a bake unit. The transfer chamber has a length longitudinally extending in a first direction Bake chambers are disposed at one side portion of opposite side portions, and liquid treating chambers are chambers provided at another side portion of the opposite side portions when viewed in the first direction. In addition, buffers are provided at opposite ends of the transfer chamber to transfer the substrate between the index module and the interface module. A cooling unit and a heating unit are sequentially arranged in a housing of the bake chamber, and a transfer plate is provided in the housing such that the substrate is transferred inside the housing. The transfer plate transfers the substrate to the heating unit. Then, when the substrate is completely heated, the substrate placed on the transfer plate is cooled through the transfer plate by the cooling unit.

However, in the substrate treating device having the above structure, since bake chambers are provided at one side portion of the opposite side portions of the longitudinal direction of the transfer chamber, the number of liquid treating chambers provided in the coating module or the developing module is limited. Accordingly, to increase the production amount of equipment, the process time of the liquid treating chamber (coating unit) may be reduced or the number of the liquid treating chamber may be increased. When the number of liquid treating chambers is increased, the related work may not be performed by using only robot.

SUMMARY

Embodiments of the inventive concept provide an apparatus and a method for treating a substrate, capable of increasing the production by increasing the number of liquid treating units such as a coating module or a developing module.

In addition, embodiments of the inventive concept provide an apparatus and a method for treating a substrate, capable of cooling a substrate when transferring the substrate between two substrate transferring robots.

In addition, embodiments of the inventive concept provide an apparatus and a method for treating a substrate, capable of reducing the step of transferring the substrate, when performing a treatment process.

In addition, embodiments of the inventive concept provide an apparatus and a method for treating a substrate, capable of simultaneously cooling a substrate while transferring the substrate.

The objects which will be achieved in the inventive concept are not limited to the above, but other objects, which are not mentioned, will be apparently understood to those skilled in the art.

According to an embodiment, an apparatus for treating a substrate may include a transfer part, a first transfer robot and a second transfer robot disposed in a longitudinal direction of the transfer part, a liquid treating part disposed at one side of the transfer part to apply a liquid onto the substrate by supplying the liquid to the substrate, and a heat treating part disposed at an opposite side of the transfer part to face a first process treating part, and configured to perform heat-treatment with respect to the substrate. The heat treating part includes a cooling transfer module to transfer the substrate between the first transfer robot and the second transfer robot and to cool the substrate.

In addition, the cooling transfer module may be disposed at a boundary at which a first moving passage of the first transfer robot meets a second moving passage of the first transfer robot.

In addition, the cooling transfer module may include a housing having a first area and a second area provided in the longitudinal direction of the transfer part, and a transfer plate provided inside the housing to transfer the substrate between the first area and the second area.

Further, the first area may be provided in a first substrate transfer area to which the first transfer robot is accessible, and the second area may be provided in a second substrate transfer area to which the second transfer robot is accessible.

In addition, the housing may include a first opening adjacent to the first area, in which the substrate is introduced into or withdrawn out of the first opening by the first transfer robot, and a second opening adjacent to the second area, in which the substrate is introduced into or withdrawn out of the second opening through the second transfer robot.

In addition, the cooling transfer module may include a cooling unit to cool a substrate. The cooling unit may be provided in at least one of the first area and the second area.

In addition, the transfer plate may include a cooling passage, through which a coolant for cooling the substrate passes.

In addition, the liquid treating part may include a first liquid treating chamber which is disposed on a moving passage to which the first transfer robot is accessible, and performs a process of applying a first liquid to the substrate, and a second liquid treating chamber which is disposed on a moving passage to which the second transfer robot is accessible and applies a second liquid to the substrate.

In addition, the first liquid is a liquid for forming an anti-reflective film on a substrate, and the second liquid may be a liquid for forming a photoresist film on the anti-reflective film formed on the substrate According to an embodiment, an apparatus for treating a substrate includes an index module and a treating module sequentially arranged in a first direction, in which the index module includes a load port to place a container, which receives the substrate, and an index frame having an index robot to transfer the substrate between the treating module and the container placed in the load port, in which the treating module includes a transfer part, a first transfer robot and a second transfer robot disposed in a longitudinal direction of the transfer part, a liquid treating part disposed at one side of the transfer part to apply a liquid onto the substrate by supplying the liquid to the substrate, and a heat treating part including a heat treating module disposed at an opposite side of the transfer part to face a first process treating part to perform heat treatment with respect to the substrate, and a cooling transfer module disposed at a boundary at which the first moving passage of the first transfer robot meets a second moving passage of the first transfer robot, to transfer the substrate between the first transfer robot and the second transfer robot and to cool the substrate.

In addition, the cooling transfer module may include a housing provided in the longitudinal direction of the transfer part and having a first area to which the first transfer robot is accessible, and a second area to which the second transfer robot is accessible, a transfer plate provided in the housing to transfer the substrate between the first area and the second area, and a cooling unit to cool the substrate provided in one of the first area and the second area.

In addition, the cooling transfer module may include a housing provided in the longitudinal direction of the transfer part and having a first area to which the first transfer robot is accessible, and a second area to which the second transfer robot is accessible, and a transfer plate provided in the housing to transfer the substrate between the first area and the second area. A cooling passage is provided in the transfer plate, such that a coolant for cooling the substrate passes through the cooling passage.

In addition, the housing may include a first opening adjacent to the first area, in which the substrate is introduced into or withdrawn out of the first opening by the first transfer robot, and a second opening adjacent to the second area, in which the substrate is introduced into or withdrawn out of the second opening through the second transfer robot.

In addition, the liquid treating part may include a first liquid treating part disposed on a moving passage, to which the first transfer robot is accessible, to perform a process of applying a first liquid to a substrate, and a second liquid treating chamber disposed on a moving passage to which the second transfer robot is accessible, to perform a process of applying a second liquid to the substrate.

According to an embodiment, an apparatus for treating a substrate includes a transfer part to provide a first transfer section and a second transfer section in a first direction, a first transfer robot disposed in the first transfer section, a second transfer robot disposed in the second transfer section, a first treating group including first liquid treating modules disposed at opposite sides of the first transfer section to apply an anti-reflective film to the substrate and a first heat treating module to perform heat treatment for the substrate in association with applying the anti-reflective film, a second treating group including second liquid treating modules disposed at opposite sides of the second transfer section to apply a photoresist film to the substrate having the anti-reflective film and a second heat treating module to perform heat treatment for the substrate in association with the applying of the photoresist, and a cooling transfer module interposed between the first heat treating module and the second heat treating module to be disposed adjacent to a boundary at which the first transfer section meets the second transfer section, and configured to transfer the substrate between the first transfer robot and the second transfer root and to cool the substrate.

In addition, the cooling transfer module may include a housing provided in the longitudinal direction of the transfer part and having a first area to which the first transfer robot is accessible, and a second area to which the second transfer robot is accessible, a transfer plate provided in the housing to transfer the substrate between the first area and the second area, and a cooling unit to be provided in one of the transfer plate, the first area, and the second area to cool the substrate.

In addition, a first plate may be provided in the second area, the substrate transported by the transport plate is placed on the first plate, and the substrate to be transported by the second transport robot stands by on the transfer plate.

According to an embodiment, a method for treating a substrate includes forming an anti-reflective film on the substrate in a first treating group, forming a photoresist film on the anti-reflective film formed on the substrate in a second treating group, and cooling a substrate having an anti-reflective film in the cooling transfer module interposed between the first treating group and the second treating group, before coating the photoresist film. In the cooling step, the first transfer robot, which transfers the substrate in the first treating group, introduces the substrate into the cooling transfer module before the cooling. The second transfer robot, which transfers the substrate in the second treating group, withdraws the substrate out of the cooling transfer module after cooling.

In addition, in the cooling, the substrate may be cooled through any one of a first area to which the first transfer robot is accessible, a second area to which the second transfer robot is accessible, and a transfer plate to transfer the substrate from the first area to the second area.

In addition, the first liquid is a liquid to form an anti-reflective film on the substrate, and the second liquid may be a liquid to form a photoresist film on the anti-reflective film formed on the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
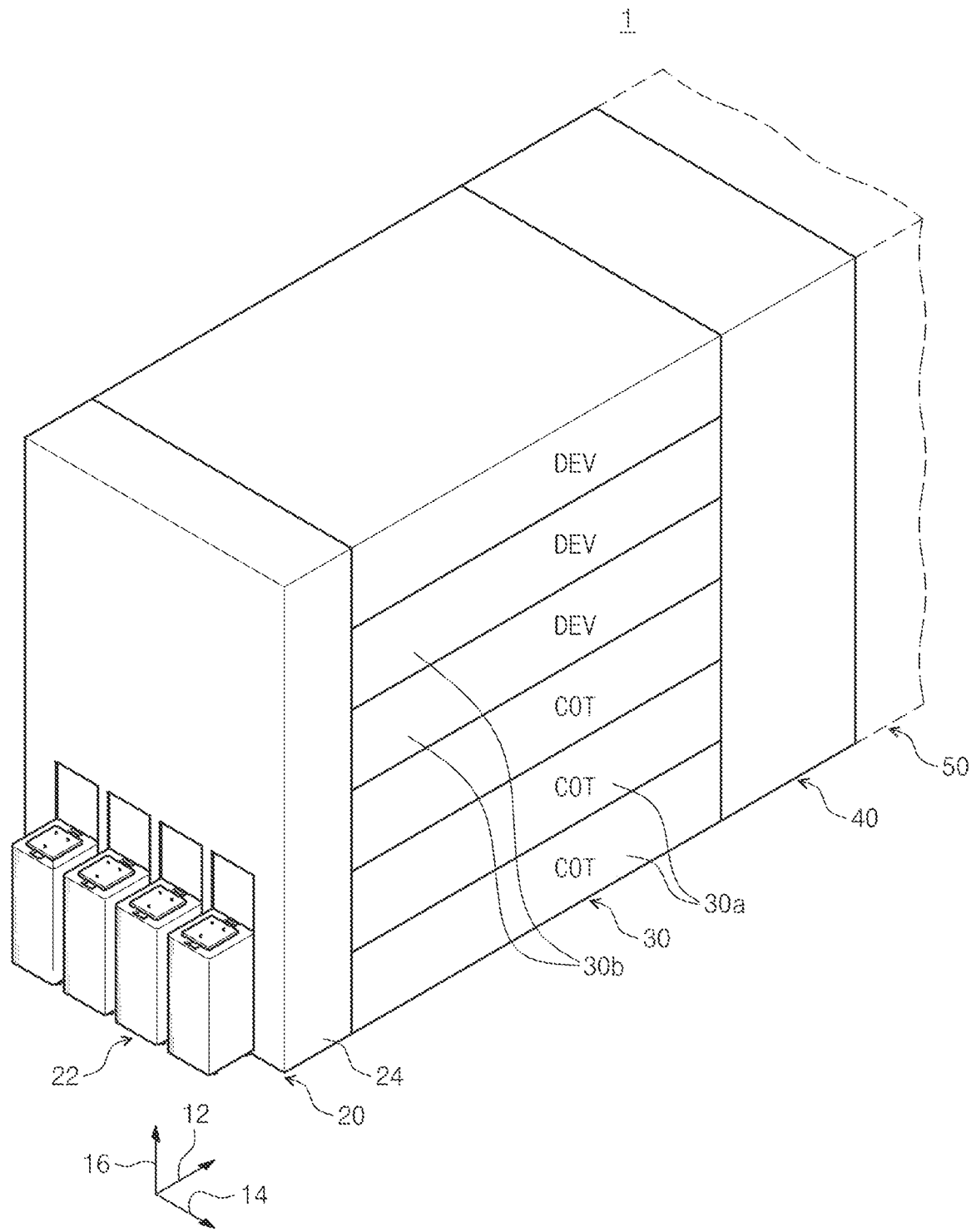
FIG. 1 is a view schematically illustrating an apparatus for treating a substrate, according to an embodiment of the inventive concept.

Hereinafter, an embodiment of the inventive concept will be described in more detail with reference to the accompanying drawings. The embodiments of the inventive concept may be modified in various forms, and the scope of the inventive concept should not be construed to be limited by the embodiments of the inventive concept described in the following. The present embodiment is provided to describe the inventive concept for those skilled in the art more completely. Accordingly, the shapes of the components in the drawings are exaggerated to emphasize clearer descriptions.

Figure 2:
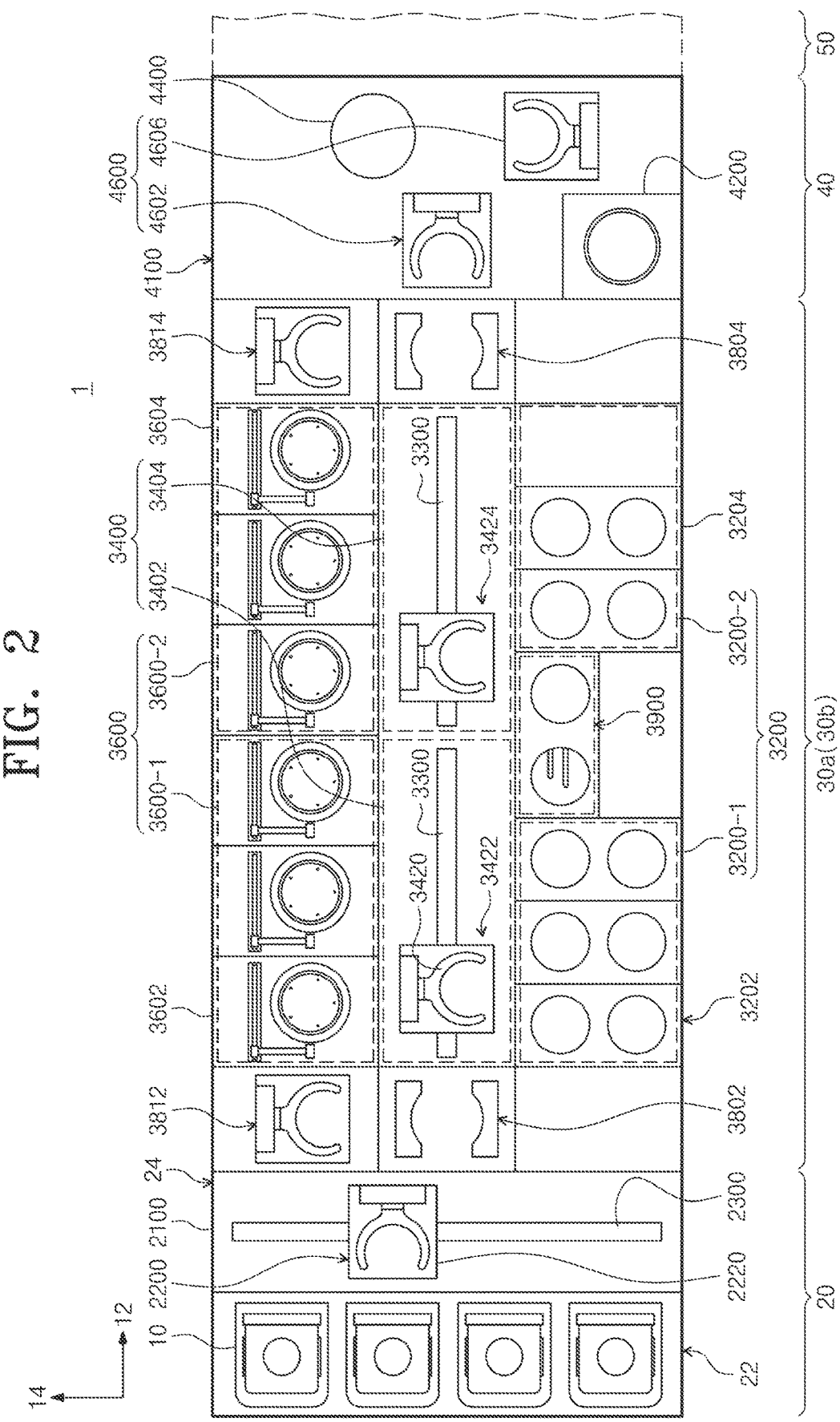
FIG. 2 is a plan view illustrating the apparatus for treating the substrate of FIG. 1.
Figure 3:
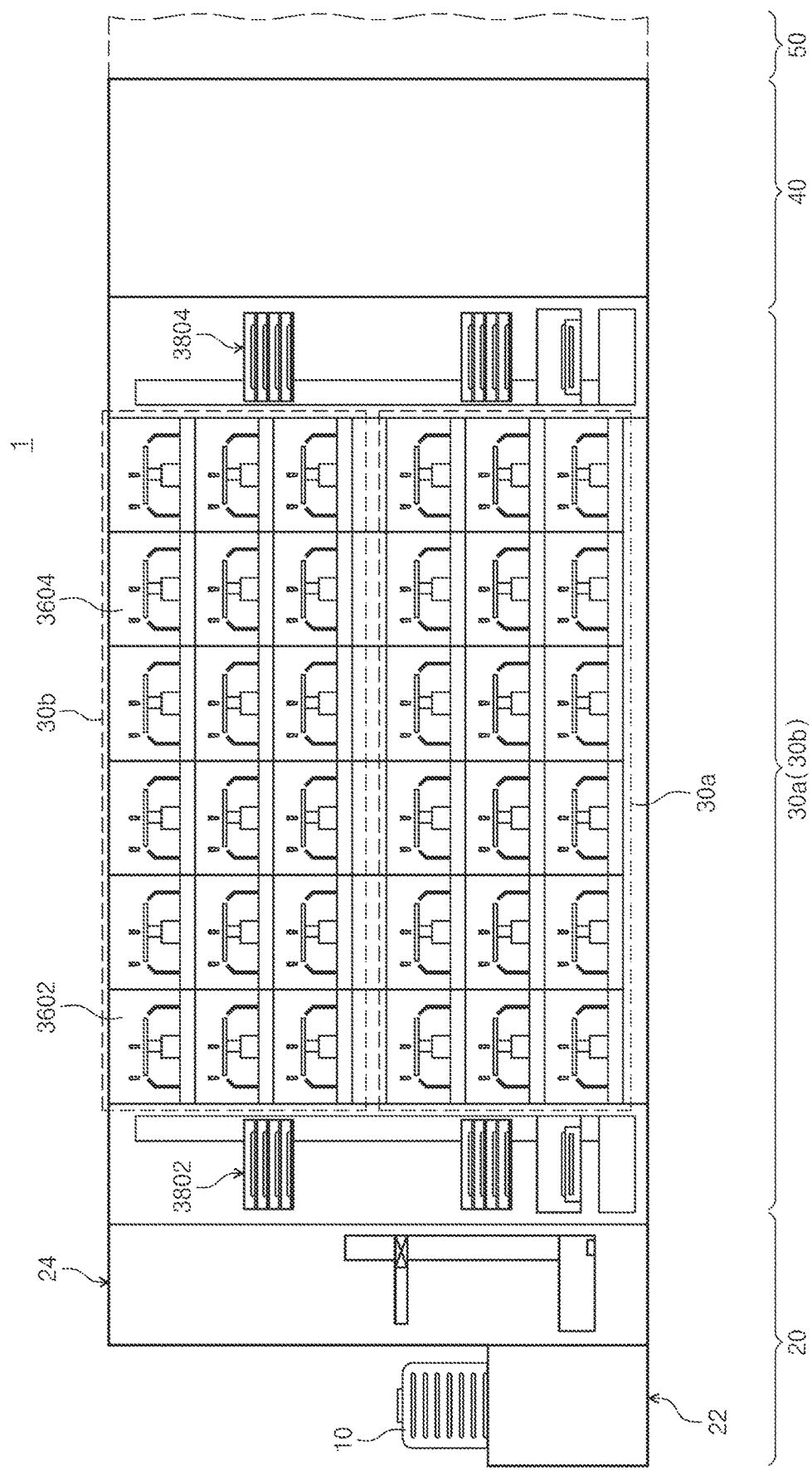
FIG. 3 is a plan view illustrating an apparatus for treating a substrate of FIG. 1, which shows a coating block.

FIG. 1 is a view schematically illustrating an apparatus for treating a substrate, according to an embodiment of the inventive concept; and FIG. 2 is a plan view illustrating the apparatus for treating the substrate of FIG. 1. FIG. 3 is a plan view illustrating an apparatus for treating a substrate of FIG. 1, which shows a coating block;

Referring to FIGS. 1 to 3, a substrate treating apparatus 1 includes an index module 20, a treating module 30, and an interface module 40.

According to an embodiment, the index module 20, the treating module 30, and the interface module 40 are sequentially aligned in line with each other. Hereinafter, a direction in which the index module 20, the treating module 30, and the interface module 40 are arranged will be referred to as a first direction 12, a direction that is perpendicular to the first direction 12 when viewed from above will be referred to as a second direction 14, and a direction perpendicular to all the first direction 12 and the second direction 14 will be referred to as a third direction 16.

The index module 20 carries a substrate "W" to the treating module 30 from a container 10 to receive the substrate "W", and a substrate "W" completely treated is received into the container 10. The longitudinal direction of the index module 20 is provided in the second direction 14. The index module 20 has a loadport 22 and an index frame 24. The loadport 22 is positioned at an opposite side of the treating module 30, based on the index frame 24. The container 10 having substrates "W" is placed on the loadport 22. A plurality of load ports 22 may be provided and may be arranged in the second direction 14.

The container 10 may include a container 10 for sealing such as a front open unified pod (FOUP). The container 10 may be placed on the load port 22 by a transport unit (not illustrated) such as Overhead Transfer, Overhead Conveyor, or Automatic Guided Vehicle, or a worker.

An index robot 2200 is provided inside the index frame 24. A guide rail 2300, which has a longitudinal direction provided in the second direction 14, may be provided in the index frame 24, and the index robot 2200 may be provided to be movable on the guide rail 2300 The index robot 2200 may include a hand 2220 in which the substrate "W" is positioned, and the hand 2220 may be provided to be movable forward and backward, rotatable about the third direction 16, and movable in the third direction 16.

The treating module 30 performs coating and developing processes with respect to the substrate "W".

The treating module 30 has a coating block 30a and a developing block 30b. The coating block 30a forms a coating process with respect to the substrate "W", and the developing block 30b performs a developing process with respect to the substrate "W". A plurality of coating blocks 30a are provided and stacked on each other. A plurality of developing blocks 30b are provided, and stacked on each other.

According to an embodiment of FIG. 1, three coating blocks 30a are provided and three developing blocks 30b are provided. The coating blocks 30a may be disposed under the developing blocks 30b. According to an example, three coating blocks 30a may be subject to the same process and may be provided in the same structure. In addition, three developing blocks 30b may be subject to the same process and may be provided in the same structure.

Referring to FIG. 2, the coating block 30a includes a heat treating part 3200, a transfer part 3400, and a liquid treating part 3600.

The transfer part 3400 transfers the substrate "W" between the heat treating part 3200 and the liquid treating part 3600 inside the coating block 30a. The transfer part 3400 may include a first transfer section 3402, which serves as a first moving passage, and a second transfer section 3404 which serves as a second moving passage. The first and second transport sections 3402 and 3404 have lengthwise directions parallel to the first direction 12 and are connected to each other. First and second transfer robots 3422 and 3424 are provided in the first and second transport sections 3402 and 3404, respectively.

According to an embodiment, the first and second transfer robot 3422 and 3422 may include a hand 3420 in which the substrate "W" is positioned, and the hand 3420 may be provided to be movable forward and backward, rotatable about the third direction 16, and movable in the third direction 16. A guide rail 3300, which has a longitudinal direction parallel to the first direction 12, is provided in the transfer chambers 3402 and 3404, and the transfer robots 3422 and 3422 may be provided to be movable on the guide rail 3300.

Figure 4:
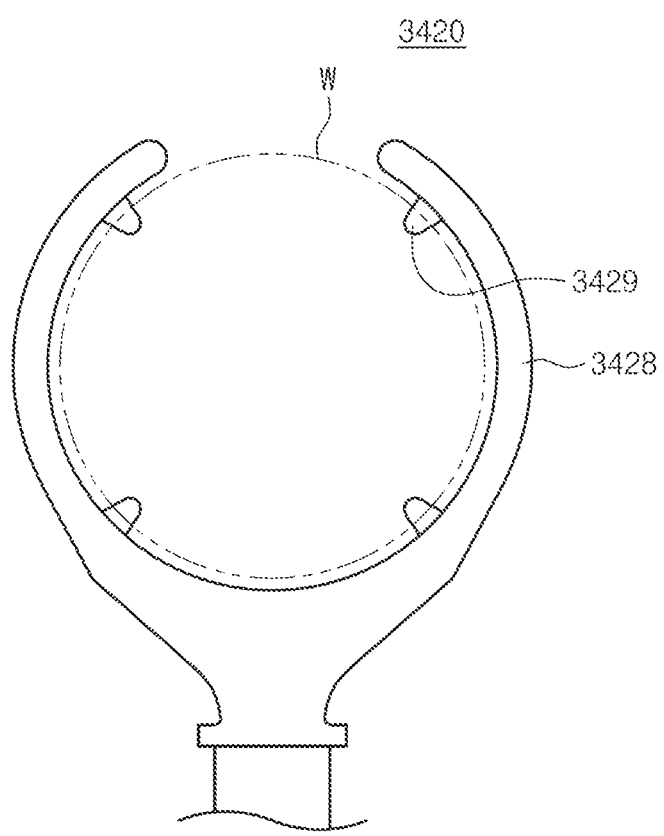
FIG. 4 is a view illustrating a hand of a transfer robot.

FIG. 4 is a view illustrating a hand of a transfer robot.

Referring to FIG. 4, the hand 3420 has a base 3428 and a supporting protrusion 3429. The base 3428 may have an annular ring shape in which a part of the circumference is bent. The base 3428 has an inner diameter greater than the diameter of the substrate "W". The supporting protrusion 3429 extends inward from the base 3428. A plurality of supporting protrusions 3429 are provided to support an edge area of the substrate "W". According to an example, four supporting protrusions 3429 may be provided at equal distances.

Referring to FIG. 2, the first and second transfer sections 3402 and 3404 may be provided in the same structure. The first transfer section 3402 is disposed to be closer to the index module 20, and the second transfer section 3404 is disposed to be closer to the interface module 40.

The heat treating part 3200 performs a heat treatment process with respect to the substrate "W". The heat treatment process may include a cooling process and a heating process. The liquid treating part 3600 supplies a liquid onto the substrate "W" to form a liquid film. The liquid film may be a photoresist film or an anti-reflective film.

The liquid treating part 3600 includes a first liquid treating part 3600-1 having liquid treating chambers to coat an anti-reflection film to the substrate "W", and a second liquid treating part 3600-2 having liquid treating chambers to coat a photoresist film to the substrate "W" having the anti-reflective film. The first liquid treating part 3600-1 is disposed on one side of the first transfer section 3402, and the second liquid treating part 3600-2 is disposed on one side of the second transfer section 3404.

The heat treating part 3200 may include a first heat treating part 3200-1 having heat treating chambers 3202 to heat-treat the substrate "W" in association with the coating of the anti-reflective film, and a second heat treating part 3200-2 having the heat treat chambers 3204 to heat-treat the substrate "W" in association with the coating the photoresist. The first heat treating part 3200-1 is disposed on an opposite side of the first transfer section 3402, and the second heat treating part 3200-2 is disposed on an opposite side of the second transfer section 3404. The heat treating chamber 3202 disposed at the side portion of the first transfer section 3402 is referred to as a front heat-treating chamber, and the heat treating chamber 3204 disposed at the side portion of the second transfer section 3404 is referred to as a rear heat-treating chamber.

The treating parts 3600-1 and 3200-1 to form the anti-reflection film on the substrate are disposed in the first transport section 3402, and the treating parts 3600-2 and 3200-2 to form the photoresist film on the substrate are disposed in the second transfer section 3404.

Meanwhile, the treating module 30 includes a plurality of buffer chambers 3802 and 3804. Some of the buffer chambers 3802 and 3804 are disposed between the index module 20 and the transfer part 3400. Hereinafter, these buffer chambers are referred to as a front buffer 3802. A plurality of front buffers 3802 are provided and are positioned to be stacked on each other in a vertical direction. Another part of the buffer chambers 3802 and 3804 is disposed between the transfer part 3400 and the interface module 40. Hereinafter, the buffer chambers are referred to as a rear buffer 3804. A plurality of rear buffers 3804 are provided and are positioned to be stacked on each other in a vertical direction. The front buffers 3802 and the rear buffers 3804 temporarily store a plurality of substrate "W" Meanwhile, buffer transfer robots 3812 and 3814 are provided in the buffer chambers to transfer the substrate "W". ##12

Figure 5:
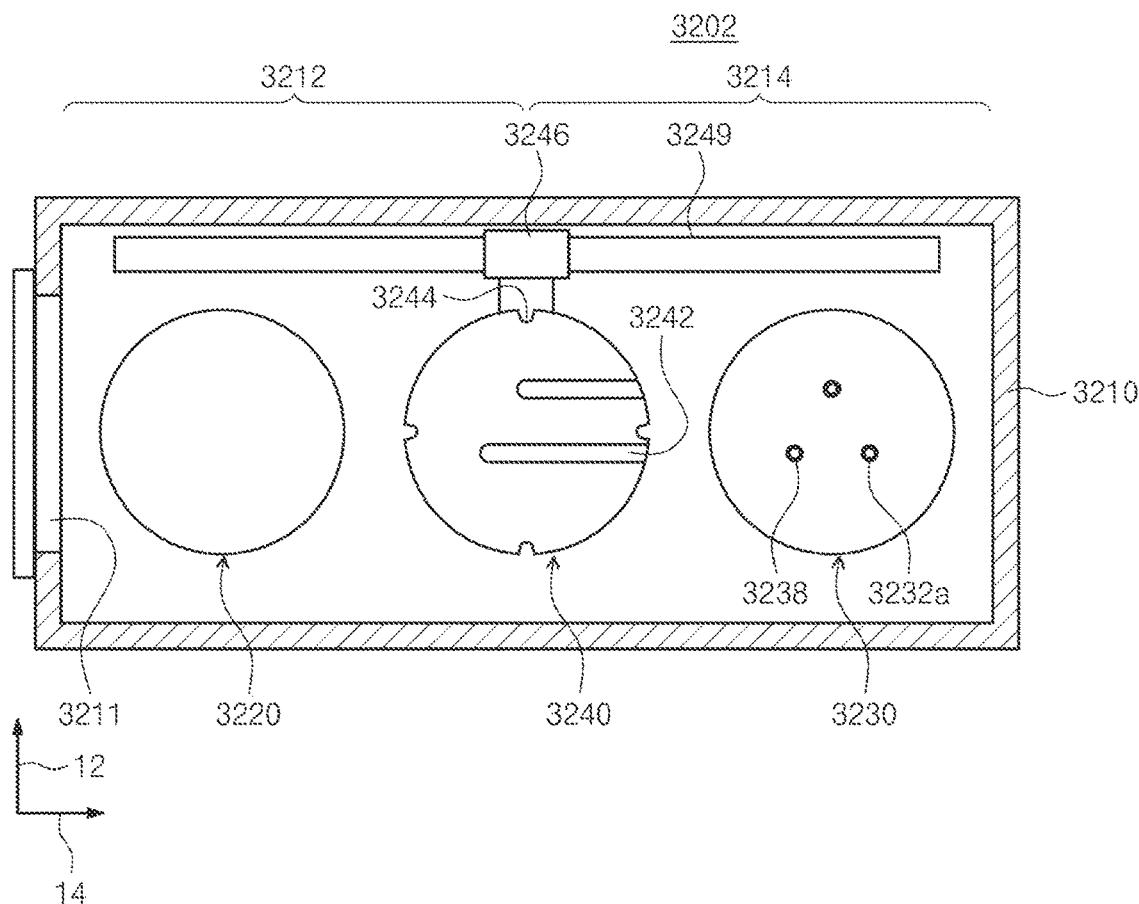
FIG. 5 is a plan view schematically illustrating a heat treating chamber.
Figure 6:
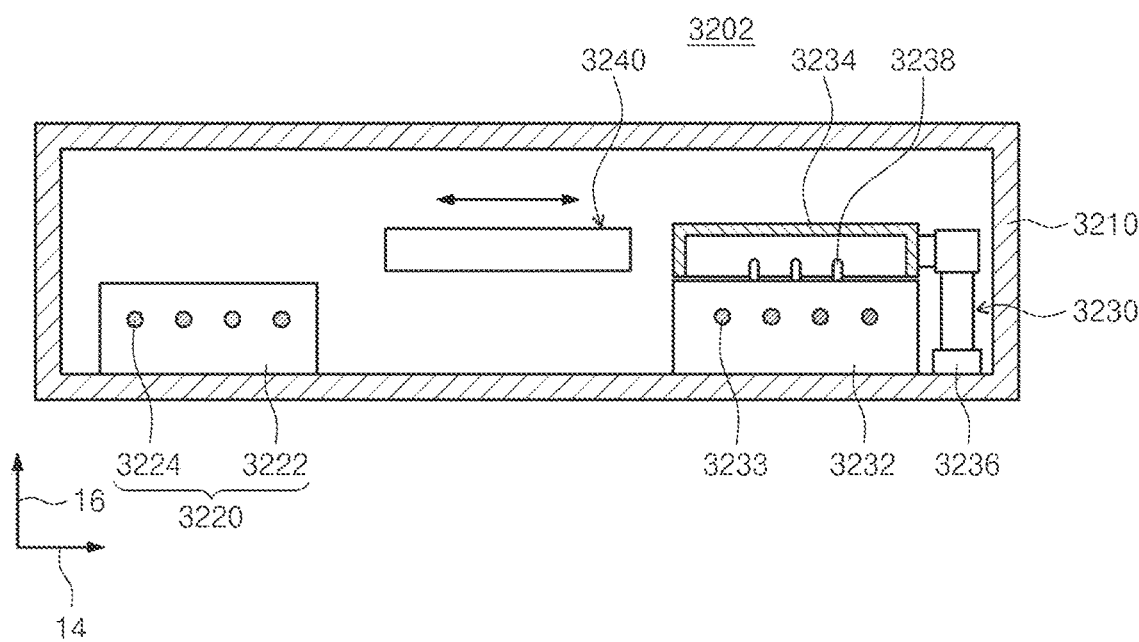
FIG. 6 is a front view illustrating the heat treating chamber of FIG. 5.

FIG. 5 is a plan view schematically illustrating a heat treating chamber of heat treating part, and FIG. 6 is a front view illustrating the heat treating chamber of FIG. 5.

The heat treating chambers 3202 and 3204 have a housing 3210, a cooling unit 3220, a heating unit 3230, and a transfer plate 3240.

The housing 3210 substantially has a rectangular parallelepiped shape. The housing 3210 is formed in a sidewall thereof with an entrance 3211 to introduce or withdraw the substrate "W". The entrance may be maintained in an open state. A door (not illustrated) may be provided to selectively open or close the entrance. The cooling unit 3220, the heating unit 3230, and the transfer plate 3240 are provided in the housing 3210. The housing 3210 has a first area 3212 and a second area 3214 formed in the housing 3210. The first area 3212 and the second area 3214 are provided side by side along the second direction 14. According to an embodiment, the cooling unit 3220 is disposed in the first area 3212, and the heating unit 3230 is disposed in the second area 3214.

The cooling unit 3220 has a cooling plate 3222. The cooling plate 3222 may have a substantially circular shape when viewed from above. The cooling plate 3222 has a cooling member 3224. According to an embodiment, the cooling member 3224 may be formed inside the cooling plate 3222 to serve as a fluid passage through which a cooling fluid flows.

The heating unit 3230 has a heating radiation 3232, a cover 3234, and a heater 3233. The heating plate 3232 may have a substantially circular shape when viewed from above. The heating plate 3232 may has a diameter larger than that of the substrate "W". A heater 3233 is placed in the heating plate 3232. The heater 3233 may be provided in the form of a heating resistor to which a current is applied. Lift pints 3238 are provided on the heating plate 3232 to be driven in the vertical direction along the third direction 16. The lift pin 3238 receives the substrate "W" from the transfer unit outside the heating unit 3230 to place the substrate "W" on the heating plate 3232 or lifts the substrate "W" from the heating plate 3232 to transmit the substrate "W" to the transfer unit outside the heating unit 3230. According to an embodiment, three lift pins 3238 may be provided. The cover 3234 has an inner space having an open lower portion. The cover 3234 is positioned at an upper portion of the heating plate 3232 and moved in a vertical direction by a driver 3236. When the cover 3234 makes contact with the heating plate 3232, the space surrounded by the cover 3234 and the heating plate 3232 are provided as a heating space for heating the substrate "W".

The conveying plate 3240 is provided in the shape of a substantially circular plate, and has a diameter corresponding to that of the substrate "W". A notch 3244 is formed in an edge of the transfer plate 3240. The notch 3244 may have the shape corresponding to a supporting protrusion 3429 formed on the hands 3420 of the transfer robots 3422 and 3424. In addition, notches 3244 may be provided in number corresponding to the number of supporting protrusions 3429 formed in the hand '3420' and may be formed at positions corresponding to the supporting protrusions 3429. When the vertical positions of the hand 3420 and the transfer plate 3240 are changed in the state that the hand 3420 and the transfer plate 3240 are aligned in the vertical direction, the substrate "W" is transferred between the hand 3420 and the transfer plate 3240. The transfer plate 3240 may be mounted on the guide rail 3249, and may move between the first area 3212 and the second area 3214 along the guide rail 3249 by the driver 3246. A plurality of guide grooves 3242 are provided in the shape of a slit in the transfer plate 3240. The guide groove 3242 extends from an end portion of the transfer plate 3240 to an inner part of the transfer plate 3240. The longitudinal direction of the guide groove 3242 is provided in the second direction 14, and the guide grooves 3242 are positioned to be spaced apart from each other in the first direction 12. The guide groove 3242 prevents the interference between the transfer plate 3240 and the lift pin 3238 when the substrate "W" is transferred between the transfer plate 3240 and the heating unit 3230

According to an embodiment of FIG. 5, the heating of the substrate "W" is achieved when the substrate "W" is directly placed on the heating plate 3232, and the cooling of the substrate "W" is achieved in the state that the transfer plate 3240 having the substrate "W" makes contact with the cooling plate 3222. The transfer plate 3240 is formed of a material having a heat transfer coefficient such that heat is smoothly transferred between the cooling plate 3222 and the substrate "W". According to an embodiment, the transfer plate 3240 may be formed of a metal material.

Heating units 3230 provided in some of the heat treating chambers 3202 and 3204 may improve the attachment rate of the photoresist to the substrate "W" by feeding gas during the heating of the substrate "W". According to an example, the gas may include hexamethyldisilane gas.

The liquid treating part 3600 has a plurality of liquid treating chambers 3602 and 3604. A plurality of liquid treating chambers 3602 and 3604 may be disposed along the longitudinal direction of the transfer unit 3400. Some of the liquid treating chambers 3602 and 3604 may be provided to be stacked on each other.

Figure 7:
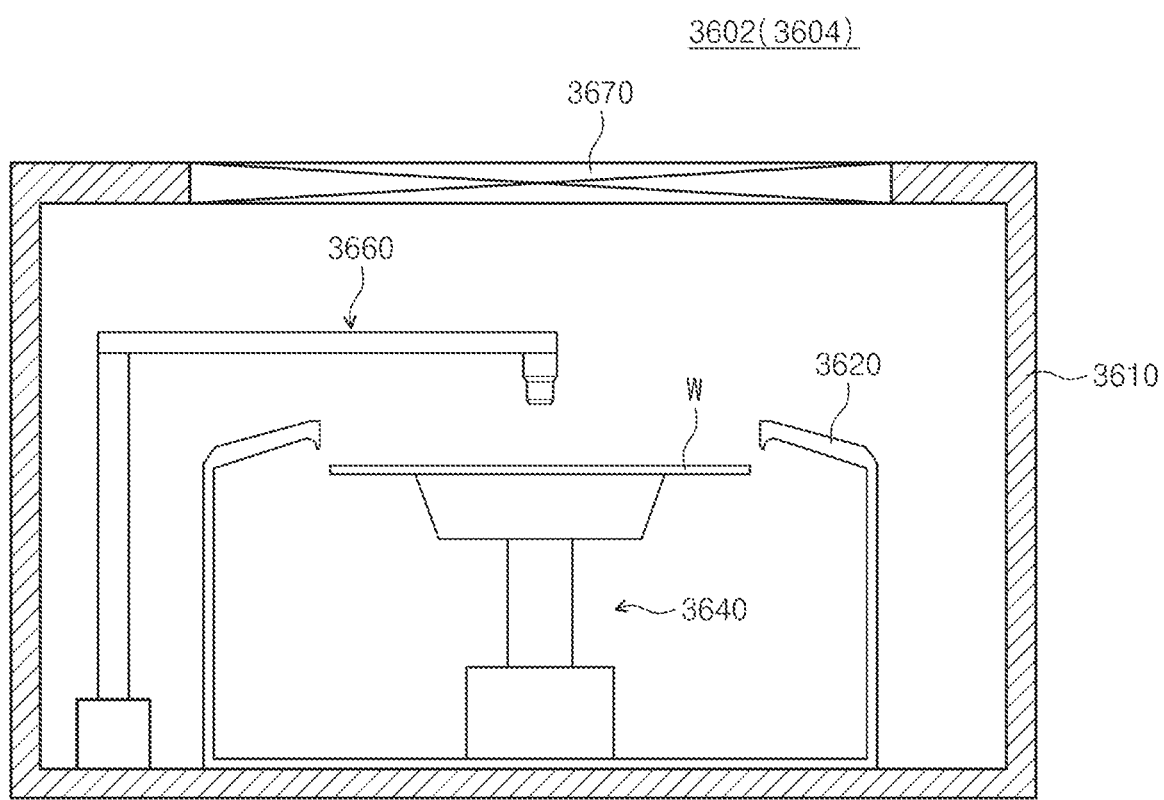
FIG. 7 is a plan view schematically illustrating a liquid treating chamber.

FIG. 7 is a plan view schematically illustrating a liquid treating chamber 3602 and 3604.

Referring to FIG. 7, the liquid treating chambers 3602 and 3604 include a housing 3610, a cup 3620, a support unit 3640, and a liquid supply unit 3660.

The housing 3610 substantially has a rectangular parallelepiped shape. The housing 3610 is formed in a sidewall thereof with an entrance (not illustrated) to introduce or withdraw the substrate "W". The entrance may be open by a door (not illustrated). The cup 3620, the substrate support unit 3640, and the liquid supply unit 3660 are provided in the housing 3610. A fan filter unit 3670 may be provided on a top wall of the housing 3610 to form a descending current inside the housing 3610. The cup 3620 has a treatment space having an open upper portion. The support unit 3640 is provided in the treatment space to support the substrate "W". The support unit 3640 is provided such that the substrate "W" is rotatable during the liquid treatment. The liquid supply unit 3660 supplies liquid to the substrate "W" supported by the support unit 3640.

Referring back to FIG. 2, some of the liquid treating chambers 3602 and 3604 may be disposed at a side portion of the first transfer section 3402. Hereinafter, these liquid treating chambers 3602 are referred to as front liquid treating chambers. Others of the liquid treating chambers 3602 and 3604 may be disposed at a side portion of the second transfer section 3404. Hereinafter, these liquid treating chambers are referred to as rear liquid treating chambers 3604. The front liquid treating chamber 3602 may be provided at one side of the first transfer section 3402 in the longitudinal direction. The rear liquid treating chambers 3604 may be provided at one side of the second transfer section 3404 in the longitudinal direction.

A first liquid is coated onto the substrate "W" in the front liquid treating chamber 3602, and a second liquid is coated to the substrate "W" in the rear liquid treating chamber 3604. The first liquid may be different from the second liquid. According to an embodiment, the first liquid is an anti-reflective liquid, and the second liquid is photoresist. The photoresist may be coated on the substrate "W" having an anti-reflective film.

The interface module 40 connects the treating module 30 with an external exposing device 50. The interface module 40 has an interface frame 4100, an additional process chamber 4200, an interface buffer 4400, and a transfer member 4600.

A fan filter unit may be provided on the upper end of the interface frame 4100 to form a descending air stream in the interface frame 4100. The additional process chamber 4200, the interface buffer 4400, and the transfer member 4600 are provided inside the interface frame 4100. The substrate "W" subject the process in the coating block 30a may be subject to a predetermined additional process in the additional process chamber 4200 before introduced into the exposing device 50. Alternatively, the substrate "W" subject the process in the exposing device 50 may be subject to a predetermined additional process in the additional process chamber 4200 before introduced into the developing block 30b. According to an embodiment, the additional process may be an edge exposing process to expose an edge area of the substrate "W", a top surface cleaning process to clean the top surface of the substrate "W", or a bottom surface cleaning process to clean the bottom surface of the substrate "W". A plurality of additional process chambers 4200 may be provided and may be provided to be stacked on each other. All the additional process chambers 4200 may be provided to perform the same process. Alternatively, some of the additional process chambers 4200 may be provided to perform mutually different processes.

The interface buffer 4400 provides a space to temporarily stay the substrate "W", which is transferred among the interface buffer 4400, the coating block 30a, the additional process chamber 4200, the exposing device 50, and the developing block 30b. A plurality of interface buffers 4400 are provided and may be provided to be stacked on each other.

The transfer member 4600 transfers the substrate "W" among the coating block 30a, the additional process chamber 4200, the exposing device 50, and the developing block 30b. The transfer member 4600 may be provided with one or a plurality of robots. According to an embodiment, the transfer member 4600 has a first robot 4602 and an interface robot 4606.

The first robot 4602 may be provided to transfer the substrate "W" among the coating block 30a, the additional process chamber 4200, and the interface buffer 4400, and the interface robot 4606 may be provided to transfer the substrate "W" between the interface buffer 4400 and the exposing device 50.

The hands of the index robot 2200, the first robot 4602, and the interface robot 4606 may all have the same shape as the hands 3420 of the transfer robots 3422 and 3424. Alternatively, the hand of the robot to directly transfer and receive the substrate "W" together with the carrying plate 3240 of the heat treatment chamber are provided in the same shapes as those of the hands 3420 of the carrying robots 3422 and 3424, and the hand of the remaining robot may be provided in the shape different from the shapes.

Referring back to FIG. 2, the cooling transfer module 3900 is provided to transfer and cool the substrate "W" between the first transfer robot 3422 and the second transfer robot 3424 The cooling transfer module 3900 is disposed in the heat treating part 3200 adjacent to the boundary where the first moving passage of the first transfer robot 3422 and the second moving passage of the second transport robot 3424. Cooling transfer modules 3900 may be stacked on each in a multi-stage, which is similar to the heat treat chamber.

Figure 8:
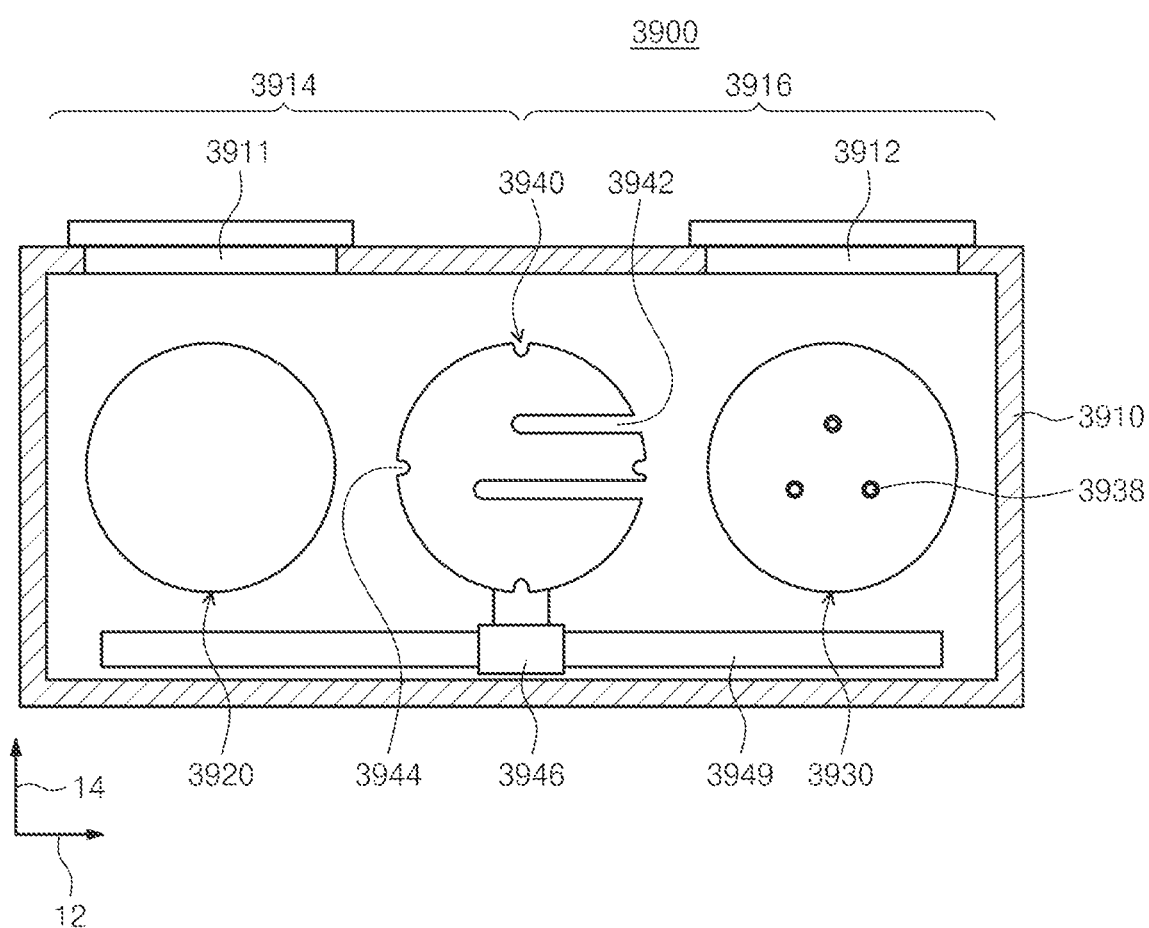
FIGS. 8 and 9 are views illustrating a cooling transfer module.
Figure 9:
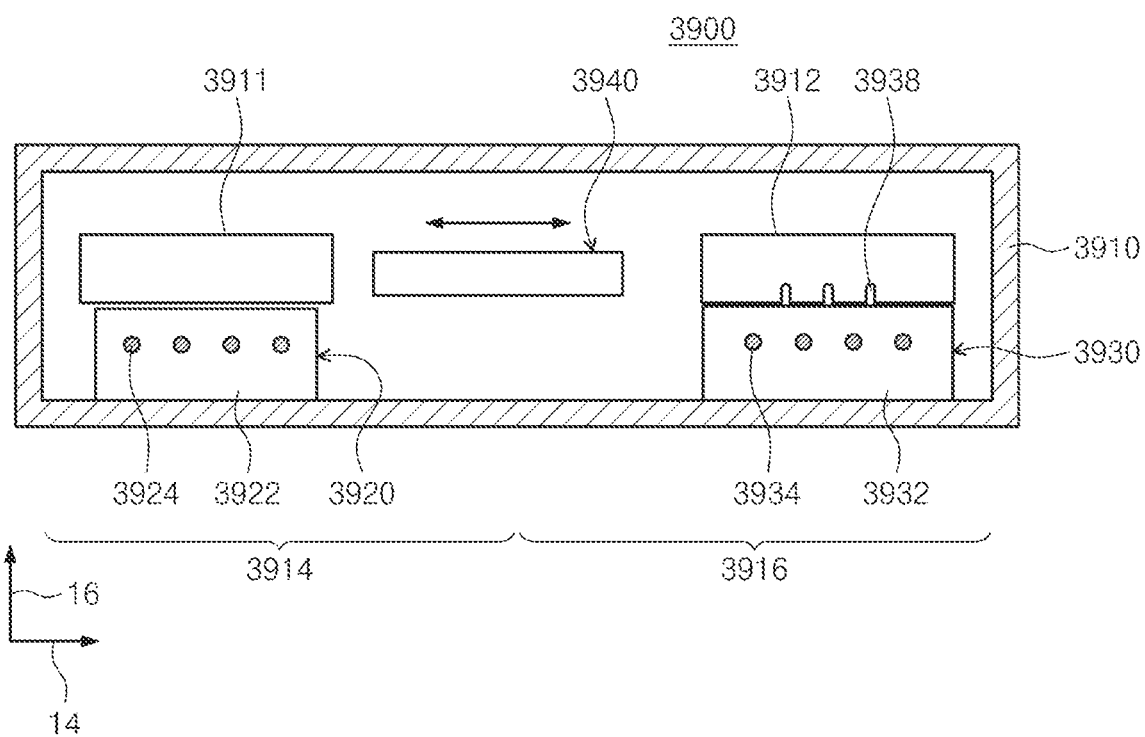

FIGS. 8 and 9 are views illustrating a cooling transfer module. ##5

Referring to FIG. 2, FIG. 8, and FIG. 9, the cooling transfer module 3900 includes a housing 3910, a first plate 3920, a second plate 3930, and a transfer plate 3940.

The housing 3910 substantially has a rectangular parallelepiped shape. The housing 3910 is formed in a sidewall thereof with first and second entrances 3911 and 3912 to introduce or withdraw the substrate "W". The first and second entrances 3911 and 3912 may be maintained in an open state. A door (not illustrated) may be provided to selectively open or close the entrance. The first opening 3911 allows the substrate to enter and exit by the first transfer robot, and the second opening 3912 allows the substrate to enter and exit by the second transfer robot.

The first plate 3920, the second plate 3930, and the transfer plate 3940 are provided in the housing 3910. The housing 3910 has a first area 3914 and a second area 3916 in the housing 3910. The first area 3914 and the second area 3916 are provided side by side in the first direction 12 which is the longitudinal direction of the transfer part. According to an embodiment, the first plate 3920 is disposed in the first area 3914, and the second plate 3930 is disposed in the second area 3916. The first area 3914 is provided in the first substrate transfer area, to which the first transfer robot is accessible, and the second area 3916 is provided in the first substrate transfer area to which the second transfer robot is accessible.

The first plate 3920 has a cooling plate 3922. The cooling plate 3922 may have a substantially circular shape when viewed from above. The cooling plate 3922 has a cooling member 3924. According to an embodiment, the cooling member 3924 may be formed inside the cooling plate 3922 to serve as a fluid passage through which a cooling fluid flows.

The second plate 3930 may have a substantially circular shape when viewed from above. Lift pints 3938 are provided on the second plate 3930 to be driven vertically along the third direction 16. The lift pin 3938 receives the substrate "W" from the transfer plate 3940 and places the substrate "W" on the second plate 3930, or lifts the substrate "W" from the top surface of the second plate 3930 and delivers the substrate "W" to the second transfer robot. For example, the second plate 3930 may have a cooling plate 3932 to cool the substrate "W" seated on the top surface of the cooling plate 3932. The cooling member 3934 having a fluid passage for the flow of the cooling fluid may be provided inside the cooling plate 3922.

The transfer plate 3940 is provided in the shape of a substantially circular plate, and has a diameter corresponding to that of the substrate "W". A notch 3944 is formed in an edge of the transfer plate 3940. The notch 3944 may have the shape corresponding to a supporting protrusion 3429 formed on the hands 3420 of the first and second transfer robots 3422 and 3424. In addition, notches 3244 may be provided in number corresponding to the number of supporting protrusions 3429 formed in the hand '3420' and may be formed at positions corresponding to the supporting protrusions 3429. When the vertical positions of the hand 3420 and the transfer plate 3940 are changed in the state that the hand 3420 and the transfer plate 3940 are aligned in the vertical direction, the substrate "W" is transferred between the hand 3420 and the transfer plate 3940. The transfer plate 3940 may be mounted on a guide rail 3949, and may move between the first area 3914 and the second area 3916 along the guide rail 3949 by the driver 3946. A plurality of guide grooves 3942 are provided in the shape of a slit in the transfer plate 3940. The guide groove 3942 extends from an end portion of the transfer plate 3940 to an inner part of the transfer plate 3940. The longitudinal direction of the guide groove 3942 is provided in the first direction 12, and the guide grooves 3942 are positioned to be spaced apart from each other in the first direction 14. The guide groove 3942 prevents the interference between the transfer plate 3940 and the lift pin 3938 when the substrate "W" is transferred between the transfer plate 3940 and the second plate 3930.

According to an embodiment with reference to FIGS. 8 and 9, the substrate "W" is cooled in the state that the transfer plate 3940 having the substrate "W" makes contact with the cooling plate 3922 of the first plate 3920. The transfer plate 3940 is formed of a material having a heat transfer coefficient such that heat is smoothly transferred between the cooling plate 3922 and the substrate "W". According to an embodiment, the transfer plate 3940 may be formed of a metal material.

For another example, cooling of the substrate "W" may be performed while the substrate "W" is placed on the second plate 3930.

For another example, the cooling of the substrate may be performed while the substrate is transferred from the first area 3914 to the second area 3916 by the transfer plate 3940. To this end, the cooling member (not illustrated) having a flow path for the flow of the cooling fluid may be provided inside the transfer plate 3940.

According to the inventive concept, the cooling transfer module 3900 may cool the substrate, as a cooling unit is provided to at least one the first plate 3920, the second plate 2930, and the transfer plate 3940, thereby cooling the substrate.

As described above, according to the inventive concept, two transfer devices may be disposed in the treating module, and the cooling transfer module is interposed between two transfer devices such that the two transfer devices deliver or receive the substrate "W", thereby improving the accessibility of the transfer robot, and overcoming the difficulty in maintenance and air control.

Hereinafter, a method for treating a substrate using the above-described apparatus for treating a substrate according to an embodiment will be described with reference to FIGS. 10 and 11.

Figure 10:
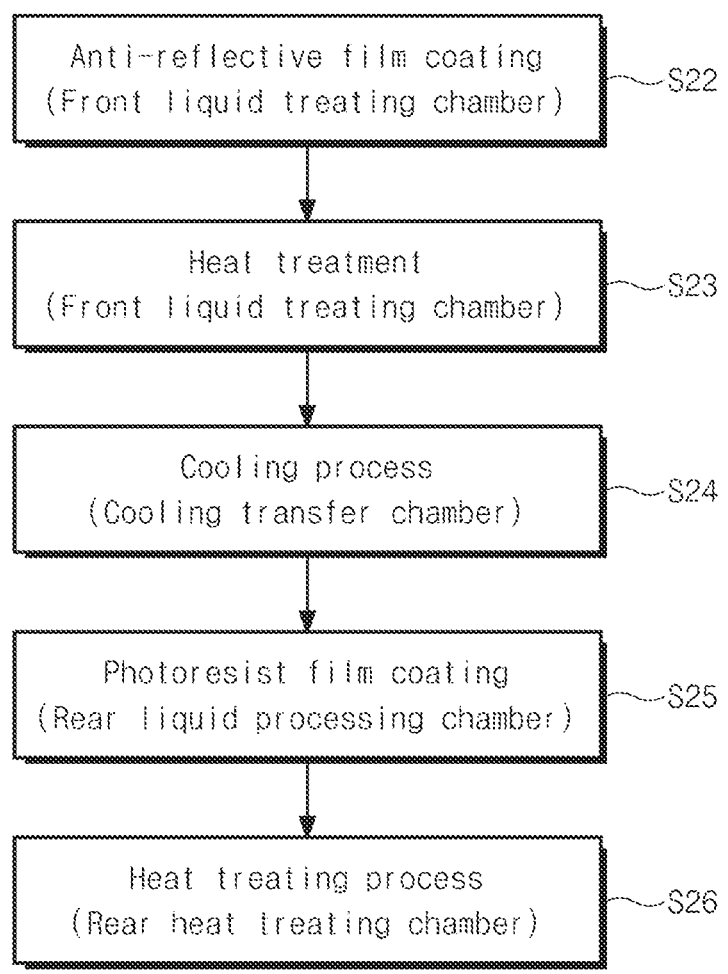
FIG. 10 is a flowchart sequentially illustrating a method for treating a substrate.
Figure 11:
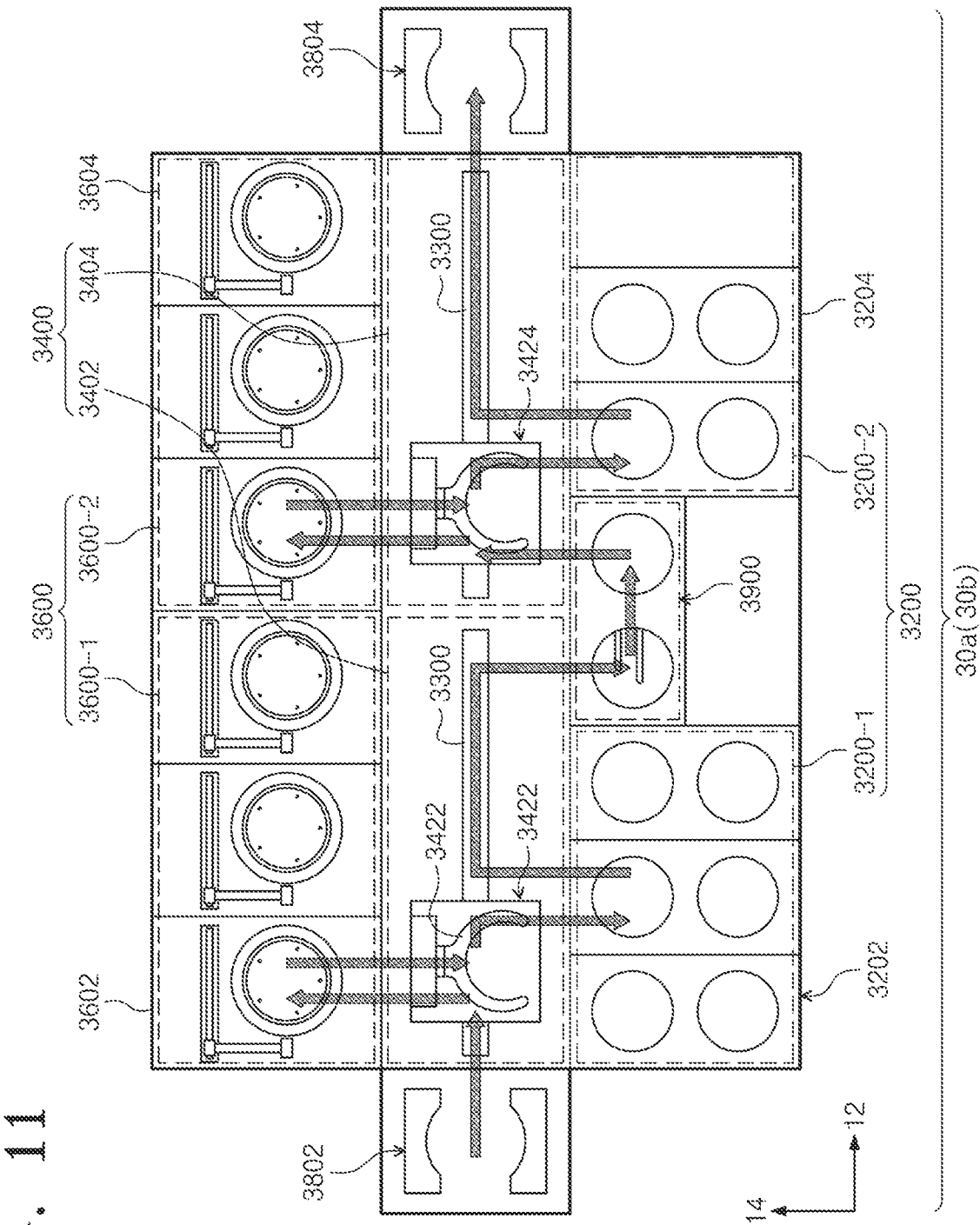
FIG. 11 is a view schematically illustrating a path for transferring a substrate until an exposing device is transferred into a container.

FIG. 10 is a flowchart sequentially illustrating a method for treating a substrate, and FIG. 11 is a view schematically illustrating a path for transferring a substrate until an exposing device is transferred into a container. Hereinafter, the details of the exposing process and the developing process will be omitted.

Referring to FIGS. 10 and 11, a coating process (S20) for the substrate "W" is performed by sequentially performing an anti-reflective film coating process (S22) in the front liquid treating chamber 3602 of the first liquid treating part 3600-1, a heat treatment process (S23) in the front heat treating chamber 3202 of the first heat treating part 3200-1, a cooling process (S24) in the cooling transfer chamber (3900), a photoresist film coating process (S25) in the rear liquid processing chamber 3604 of the second liquid treating part 3600-2, and a heat treating process (S26) in the rear heat treating chamber 3204 of the second heat treating part 3200-2.

Hereinafter, a path of transferring the substrate "W" in the coating block will be described with reference to FIG. 11.

The first transfer robot 3422 withdraws the substrate "W" out of the front buffer 3802 and transfers the substrate "W" to the front liquid treating chamber 3602. When the anti-reflective film is completely coated, the first transfer robot 3422 withdraws the substrate "W" from the front liquid treating chamber 3602 and transfers the substrate "W" to the front heat treating chamber 3202. When the heat treatment is completed, the first transfer robot 3422 withdraws the substrate "W" out of the front heat treating chamber 3202 and transfers the substrate "W" to the transfer plate 3940 through the first opening 3911 of the cooling transfer chamber 3900. The substrate "W" is cooled and transferred in the cooling transfer chamber 3900. The substrate "W" which is completely cooled stands by on the second plate 3930. The second transfer robot 3424 withdraws the substrate "W" through the second opening 3912 and transfers the substrate "W" to the rear liquid treating chamber 3604. When the photoresist film is completely coated, the second transfer robot 3424 withdraws the substrate "W" out of the rear liquid treating chamber 3604 and transfers the substrate "W" to the rear heat treating chamber 3204. When the heat treatment is completed, the second transfer robot 3424 withdraws the substrate "W" out of the rear heat treating chamber 3204 and transfers the substrate "W" to the rear buffer 3804. The substrate "W" may be cooled in the rear buffer 3804. For another example, when the heat treatment is completed, the second transport robot 3424 withdraws the substrate "W" out of the rear heat treating chamber 3204 and transfers the substrate "W" to the second plate 3930 through the second opening 3912 of the cooling transport chamber 3900 to cool the substrate "W". The substrate "W" may be transferred to the rear buffer 3804

For reference, the heat treatment process for the substrate may be added, before coating the anti-reflective film and before coating the photoresist film.

According to the inventive concept, many treating chambers may be provided in a confined space in the coating module or the developing module.

In addition, according to the inventive concept, the transfer step of the substrate may be reduced when the treatment process is performed.

In addition, according to the inventive concept, the air flow may be easily controlled in the transfer space.

In addition, according to the inventive concept, the cooling treatment may be performed with respect to the substrate in the process of transferring the substrate in the cooling transfer chamber.

The effects produced in the inventive concept are not limited to the aforementioned effects, and any other effects not mentioned herein will be clearly understood from the detailed description and accompanying drawings by those skilled in the art to which the inventive concept pertains.

The above description has been made for the illustrative purpose. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. The written embodiment describes the best state for implementing the technical spirit of the inventive concept, and various changes required in the detailed application fields and purposes of the inventive concept can be made. Furthermore, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
    a transfer part;
    a first transfer robot and a second transfer robot disposed in the transfer part to align and overlap with each other in a longitudinal direction of the transfer part;
    a liquid treating part disposed at one side of the transfer part to apply a liquid onto the substrate by supplying the liquid to the substrate; and
    a heat treating part disposed at an opposite side of the transfer part, and configured to perform heat-treatment with respect to the substrate,
    wherein the heat treating part includes:
    a front-heating chamber and a rear heat-treating chamber;
    a cooling transfer module provided to exchange the substrate between the first transfer robot and the second transfer robot, and to cool the substrate,
    wherein the first transfer robot moves in a first moving passage and the second transfer robot moves in a second moving passage, the first moving passage and the second moving passage being disposed in immediate adjacent to each other in the longitudinal direction of the transfer part,
    wherein the cooling transfer module, the transfer part, and the liquid treating part are sequentially stacked in a traversal direction of the transfer part perpendicular to the longitudinal direction of the transfer part; and
    wherein the cooling transfer module is disposed underneath at a boundary at which the first moving passage of the first transfer robot meets the second moving passage of the first transfer robot and between the front-heating chamber and the rear heat-treating chamber.

2. The apparatus of claim 1, wherein the cooling transfer module includes:
    a housing having a first area and a second area provided in the longitudinal direction of the transfer part; and
    a transfer plate provided inside the housing to transfer the substrate between the first area and the second area.

3. The apparatus of claim 2, wherein the first area is provided in a first substrate transfer area to which the first transfer robot is accessible, and
    wherein the second area is provided in a second substrate transfer area to which the second transfer robot is accessible.

4. The apparatus of claim 2, wherein the housing includes:
    a first opening adjacent to the first area, wherein the substrate is introduced into or withdrawn out of the first opening by the first transfer robot; and
    a second opening adjacent to the second area, wherein the substrate is introduced into or withdrawn out of the second opening by the second transfer robot.

5. The apparatus of claim 2, wherein the cooling transfer module includes:
    a cooling unit to cool the substrate, and
    wherein the cooling unit is provided in at least one of the first area and the second area.

6. The apparatus of claim 2, wherein the transfer plate includes:
    a cooling passage formed in the transfer plate, such that a coolant for cooling the substrate passes through the cooling passage.

7. The apparatus of claim 2, wherein the liquid treating part includes: a first liquid treating chamber disposed on the first moving passage, to which the first transfer robot is accessible, to perform a process of applying a first liquid to the substrate; and a second liquid treating chamber disposed on the second moving passage, to which the second transfer robot is accessible, to apply a second liquid to the substrate.

8. The apparatus of claim 7, wherein the first liquid is a liquid for forming an anti-reflective film on the substrate; and
    wherein the second liquid is a liquid for forming a photoresist film on the anti-reflective film formed on the substrate.

* * * * *